(12) United States Patent
Saw et al.

(10) Patent No.: US 12,021,000 B2
(45) Date of Patent: Jun. 25, 2024

(54) SEMICONDUCTOR PACKAGE AND METHOD FOR FABRICATING A SEMICONDUCTOR PACKAGE

(71) Applicant: Infineon Technologies AG, Neubiberg (DE)

(72) Inventors: Khay Chwan Andrew Saw, Melaka (MY); Chau Fatt Chiang, Melaka (MY); Norliza Morban, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/386,654

(22) Filed: Jul. 28, 2021

(65) Prior Publication Data
US 2022/0037222 A1 Feb. 3, 2022

(30) Foreign Application Priority Data
Jul. 28, 2020 (DE) .......................... 102020119849.3

(51) Int. Cl.
| | |
|---|---|
| *H01L 23/31* | (2006.01) |
| *H01L 21/48* | (2006.01) |
| *H01L 21/56* | (2006.01) |
| *H01L 23/00* | (2006.01) |
| *H01L 23/538* | (2006.01) |

(52) U.S. Cl.
CPC ...... *H01L 23/3107* (2013.01); *H01L 21/4832* (2013.01); *H01L 21/56* (2013.01); *H01L 23/5389* (2013.01); *H01L 24/06* (2013.01); *H01L 24/48* (2013.01); *H01L 24/97* (2013.01); *H01L 2224/04105* (2013.01); *H01L 2224/97* (2013.01); *H01L 2924/181* (2013.01)

(58) Field of Classification Search
CPC ...... H01L 23/3107; H01L 24/06; H01L 24/97
See application file for complete search history.

(56) References Cited

U.S. PATENT DOCUMENTS

| | | | |
|---|---|---|---|
| 8,535,982 B1 | 9/2013 | O'Brien et al. | |
| 9,219,019 B2 | 12/2015 | Lohia et al. | |
| 9,972,558 B1 | 5/2018 | Talledo et al. | |
| 2009/0008793 A1* | 1/2009 | Pohl | H01L 24/82 |
| | | | 438/109 |
| 2017/0345714 A1* | 11/2017 | Scharf | H01L 21/78 |
| 2019/0237373 A1* | 8/2019 | Huang | H05K 1/185 |

FOREIGN PATENT DOCUMENTS

| | | |
|---|---|---|
| DE | 102014117337 A1 | 5/2015 |
| EP | 3355348 A1 | 8/2018 |

* cited by examiner

*Primary Examiner* — Trang Q Tran
(74) *Attorney, Agent, or Firm* — Murphy, Bilak & Homiller, PLLC

(57) ABSTRACT

A semiconductor package includes a semiconductor die, an encapsulation encapsulating the semiconductor die, the encapsulation having a first side and an opposing second side, a plurality of contact pads for electrically contacting the semiconductor die, the contact pads being arranged on the first side of the encapsulation, and a plurality of inspection holes arranged in communication with the contact pads and extending from the first side to the second side, such that solder joints on the first side of the encapsulation are optically inspectable using the inspection holes viewed from the second side of the encapsulation.

10 Claims, 5 Drawing Sheets

SEMICONDUCTOR PACKAGE AND METHOD FOR FABRICATING A SEMICONDUCTOR PACKAGE

TECHNICAL FIELD

This disclosure relates in general to semiconductor packages as well as to methods for fabricating semiconductor packages.

BACKGROUND

A semiconductor package may be configured as a surface mounted device (SMD) which is to be mounted on and electrically coupled to a substrate like an application board. The connection between the semiconductor package and the substrate may be provided by a plurality of solder joints. E.g. for quality control reasons, it may be desirable to check the solder joints for defects (e.g. solder joints that are too small or that did not form at all). Since the inspection process contributes to the overall time and costs of coupling the semiconductor package to the substrate, cost-effective ways of checking the solder joints are desirable. However, in particular those solder joints that are not arranged at an edge of the semiconductor package are concealed by the semiconductor package and by the substrate on all sides which makes an easy inspection difficult or impossible. Improved semiconductor packages and improved methods for fabricating semiconductor packages may help with solving these and other problems.

The problem on which the invention is based is solved by the features of the independent claims. Further advantageous examples are described in the dependent claims.

SUMMARY

Various aspects pertain to a semiconductor package, comprising: a semiconductor die, an encapsulation encapsulating the semiconductor die, the encapsulation comprising a first side and an opposing second side, a plurality of contact pads for electrically contacting the semiconductor die, the contact pads being arranged on the first side of the encapsulation, and a plurality of inspection holes arranged in communication with the contact pads and extending from the first side to the second side, such that solder joints on the first side of the encapsulation are optically inspectable using the inspection holes viewed from the second side of the encapsulation.

Various aspects pertain to a method for fabricating a semiconductor package, the method comprising: providing a semiconductor die, encapsulating the semiconductor die in an encapsulation, the encapsulation comprising a first side and an opposing second side, arranging a plurality of contact pads for electrically contacting the semiconductor die on the first side of the encapsulation, and arranging a plurality of inspection holes in the encapsulation in communication with the contact pads, the inspection holes extending from the first side to the second side, such that solder joints on the first side of the encapsulation are optically inspectable using the inspection holes viewed from the second side of the encapsulation.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

Figure 1:
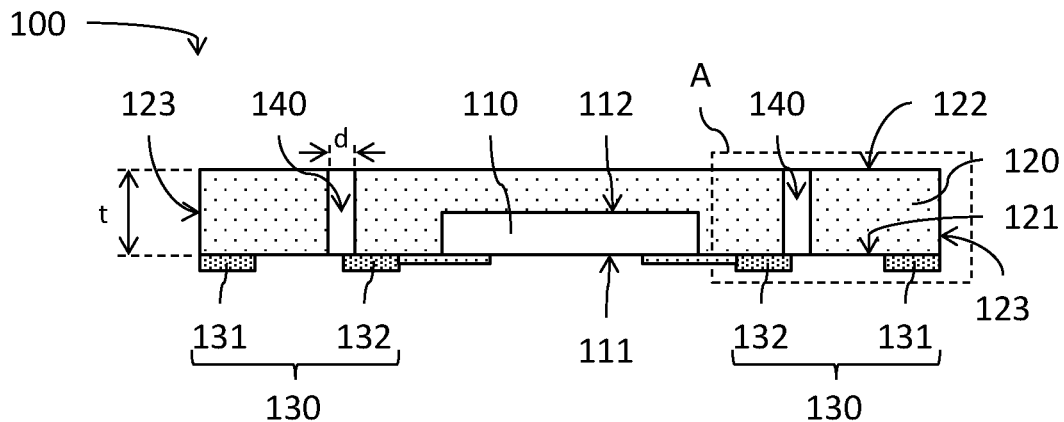
FIG. 1 shows a sectional view of a semiconductor package comprising a plurality of inspection holes arranged over a plurality of contact pads.

In the following detailed description, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration only. It is to be understood that other examples may be utilized and structural or logical changes may be made.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor package may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, etc.

The semiconductor packages described below may include one or more semiconductor dies. By way of example, one or more power semiconductor power dies may be included. Further, one or more logic integrated circuits may be included in the devices. The logic integrated circuits may be configured to control the integrated circuits of other semiconductor dies, for example the integrated circuits of power semiconductor dies.

The semiconductor dies may have electrodes which allow electrical contact to be made with the integrated circuits included in the semiconductor dies. The electrodes may be arranged all at only one main face of the semiconductor dies or at both main faces of the semiconductor dies. They may include one or more electrode metal layers which are applied to the semiconductor material of the semiconductor dies. The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

FIG. 1 shows a semiconductor package 100 which comprises a semiconductor die 110, an encapsulation 120, a plurality of contact pads 130 and a plurality of inspection holes 140.

The encapsulation 120 comprises a first side 121 and an opposing second side 122 and is configured to encapsulate the semiconductor die 110. The plurality of contact pads 130 is arranged on the first side 121 of the encapsulation 120. The contact pads 130 are configured for providing electrical contact with the semiconductor die 110. The inspection holes 140 are arranged in communication with the contact pads 130 and extend from the first side 121 of the encapsulation 120 to the second side 122, such that solder joints on the first side 121 of the encapsulation 120 are optically inspectable using the inspection holes 140, viewed from the second side 122 of the encapsulation 120.

The semiconductor die 110 may comprise a vertical transistor structure or a horizontal transistor structure. In other words, the semiconductor die 110 may comprise electrodes on both opposing main sides 111, 112 or it may comprise electrodes only on one of the main sides 111, 112, e.g. on the first main side 111. At least some of the electrodes may be electrically coupled to the contact pads 130.

According to an example, the first main side 111 of the semiconductor die 110 may be coplanar with the first side 121 of the encapsulation and/or the second main side 112 of the semiconductor die 110 may be coplanar with the second side 122 of the encapsulation 120. However, it is also possible that only one of the main sides 111, 112 or neither of them is coplanar with the first or second side 121, 122.

The encapsulation 120 may for example comprise a molded body and/or a laminate. The encapsulation 120 may comprise a polymer. The encapsulation 120 may further comprise a filler material, for example in order to improve the thermal and/or mechanical characteristics of the encapsulation 120. The encapsulation 120 may have any suitable shape as seen from above the second side 122, e.g. a quadratic or a rectangular shape.

The encapsulation 120 may have any suitable thickness t, e.g. a thickness t of 500 μm or more, 800 μm or more, 1 mm or more, or 2 mm or more. A length of the inspection holes 140 may correspond to the thickness t.

The contact pads 130 may be configured for surface mounting the semiconductor package 100 to a substrate such that the first side 121 of the encapsulation 120 faces the substrate and such that the contact pads 130 provide an electrical contact between the semiconductor package 100 and the substrate. The semiconductor package 100 may for example be a package of the ball grid array (BGA) type or of the land grid array (LGA) type.

The contact pads 130 may be metal pads and they may for example be part of a plating layer. The contact pads 130 may for example comprise or consist of Ag, Au, Cu Ni, or any other suitable metal or metal alloy. The contact pads 130 may have any suitable shape as seen from below the second side 122, e.g. a quadratic, rectangular, or round shape.

In the example shown in FIG. 1, the encapsulation 120 comprises a single body and the contact pads 130 are arranged directly on the first side 121 of that single body. According to another example, the encapsulation 120 may further comprise a structure like a laminate, a substrate, a PCB (printed circuit board), etc. arranged on the first side 121 and the contact pads 130 may be arranged on said structure. In this case, the inspection holes 140 may also extend through the structure.

As shown in the example of FIG. 1, the inspection holes 140 may extend completely through the encapsulation 120 from the first side 121 to the second side 122. The inspection holes 140 may have any suitable shape as seen from above the first side 121 or from below the second side 122, e.g. a quadratic, rectangular, or round shape. The inspection holes 140 may have any suitable diameter (or width) d, e.g. a diameter d of 50 μm or more, 100 μm or more, 500 μm or more, or 1 mm or more.

According to an example, the encapsulation comprises lateral sides 123 connecting the first and second sides 111, 112. The semiconductor package 100 may further comprise a first class of contact pads 131 and a second class of contact pads 132, wherein the contact pads 130 of the first class of contact pads 131 are arranged along the lateral sides 123 and wherein the contact pads 130 of the second class contact pads 132 are spaced away from the lateral sides 123. The inspection holes 140 may be arranged solely above the contact pads 130 of the second class of contact pads 132. According to another example, the inspection holes 140 are arranged over all of the contact pads 130.

The contact pads 130 of the first class of contact pads 131 may be arranged along the lateral sides 123 of the encapsulation 120 such that each contact pad 130 directly abuts the respective lateral side 123. Furthermore, the contact pads 130 of the first class of contact pads 131 may extend onto the lateral sides 123 as shown in the example of FIG. 2.

Each inspection hole 140 may be arranged along an edge of the respective contact pad 130. In other words, a sidewall of the inspection hole 140 may be coplanar with a lateral end of the respective contact pad 130. In this case, it is also possible that the contact pad 130 extends into the respective inspection hole 140 as shown in the example of FIG. 2.

Figure 2:
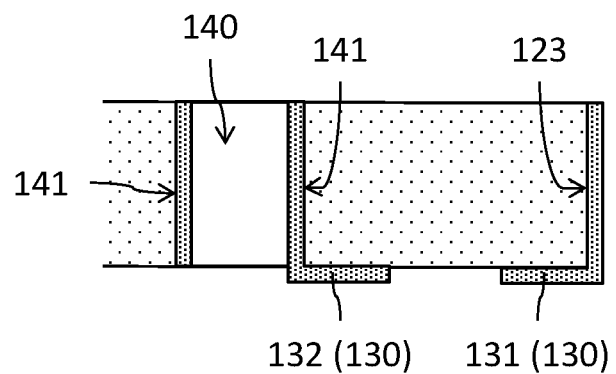
FIG. 2 shows a detail view of an inspection hole of the semiconductor package of FIG. 1.

FIG. 2 shows a detail view of the section A in FIG. 1, according to an example of the semiconductor package 100. In the example of FIG. 2 the inspection holes 140 comprise side walls 141 which are covered by a plating layer that is part of the contact pad 130. This means that the contact pads 130 extend into the inspection holes 140. In particular, all sidewalls 141 may be completely covered by the plating layer. The plating layer may for example comprise or consist of Ag, Au, Cu Ni, or any other suitable metal or metal alloy.

Furthermore, the contact pads 130 of the first class of contact pads 131 may extend onto the lateral sides 123 of the encapsulation 120. This means that a plating layer may also be arranged on the lateral sides 123.

According to an example, the parts of the contact pads that are arranged on the first side 121 of the encapsulation and on the sidewalls 141 or lateral sides 123, respectively, may be parts of the same plating layer (i.e. they may be fabricated in the same fabrication process).

Fabricating the contact pads 130 may comprise using a laser-activatable encapsulant for the encapsulation 120. A "laser-activatable encapsulant" may refer to an encapsulant containing at least one additive, e.g. in the form of an organic metal complex which is activated by a physiochemical reaction induced by a focused laser beam. The laser activation process involves directing a laser beam onto the laser-activatable encapsulant of the encapsulation 120. The energy of the laser beam generates laser-activated regions in the encapsulation 120. A "laser-activated region" refers to a region of the laser-activatable encapsulant that has reacted with the laser beam such that organic metal complexes are present on the surface of the laser-activatable encapsulant and can act as nuclei for a subsequent metal coating process. In contrast to this, those parts of the laser-activatable encapsulant that are not exposed to the laser beam do not have any exposed metal complexes that can act as nuclei during the metal plating process.

The subsequent plating process can be any metal plating process that uses a seed metal as the basis for depositing metal thereon. The semiconductor package 100 may for example be immersed in a chemical bath containing metal ions (e.g. Cu+ ions, Ni+ ions, Ag+ ions, etc.) which react with the organic metal complexes in the laser-activated regions to form the contact pads 130 of the element from the chemical bath.

Figure 3A:
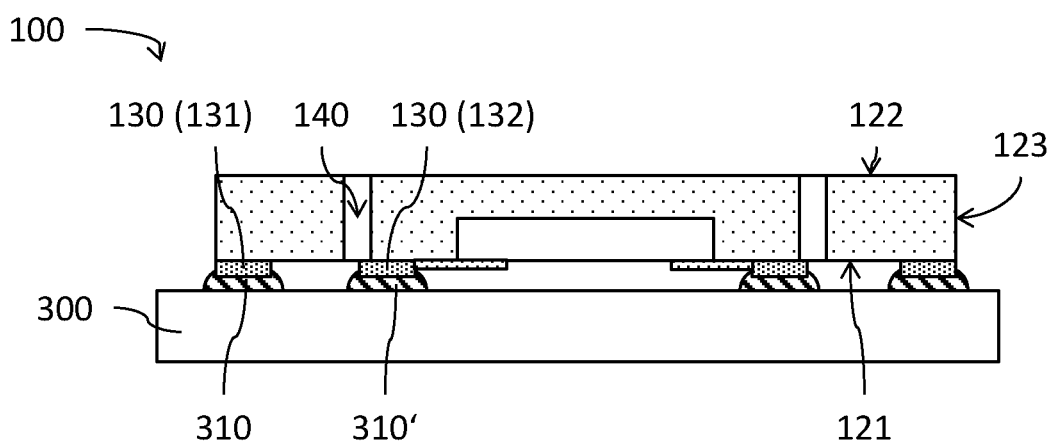
FIGS. 3A to 3C show sectional views of a semiconductor package coupled to a substrate according to different specific examples.
Figure 3B:
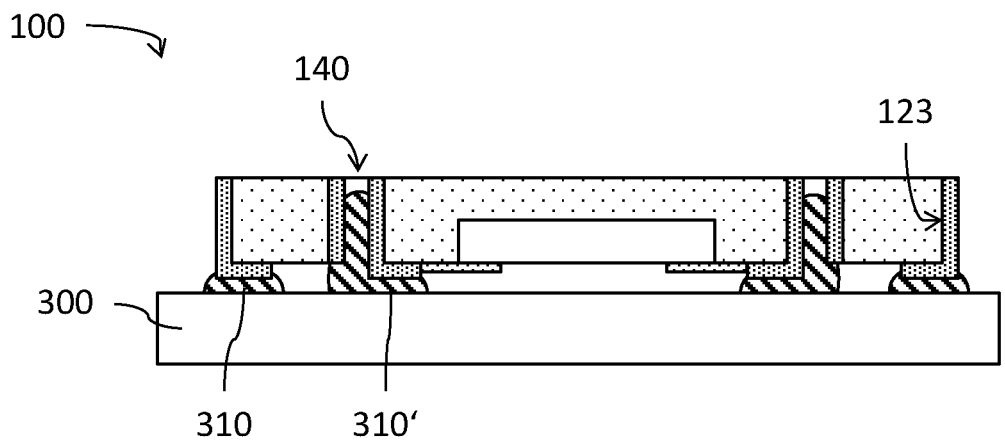
Figure 3C:
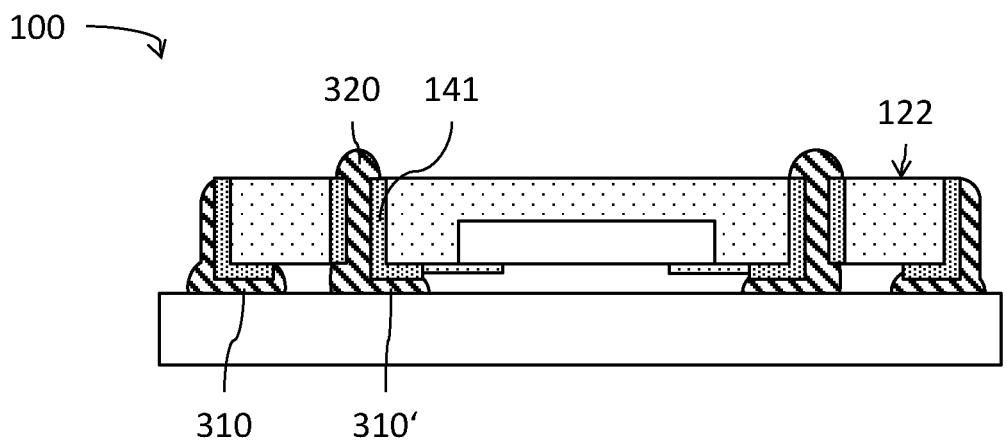

FIGS. 3A to 3C show examples of the semiconductor package 100 arranged on and coupled to a substrate 300. The substrate 300 may e.g. comprise an application board. The semiconductor package 100 may be coupled to the substrate 300 by solder joints 310, 310' that are arranged on the contact pads 130. The semiconductor package 100 may e.g. comprise the first class of contact pads 131 and the second class of contact pads 132.

It may be desirable to be able to optically inspect the solder joints 310, 310', e.g. for reasons of quality control. Such an optical inspection may e.g. comprise placing a camera above the second side 122 of the encapsulation 120 and observing the solder joints 310, 310' in the visible spectrum. The outer solder joints 310 may be visible from above the second side 122, e.g. because there may be some solder bleed-out beyond the circumference of the lateral sides 123.

The inner solder joints 310' on the other hand can only be checked optically from above the second side 122 by looking through the inspection holes 140. If solder material can be seen through an inspection hole 140, then the respective inner solder joint 310' was formed properly. If however no solder material or too small an amount of solder material is visible when looking through an inspection hole 140, then it may be assumed that the respective inner solder joint 310' did not form properly or was not formed at all.

In the example shown in FIG. 3A, the solder joints 310, 310' are essentially arranged between the first side 121 of the encapsulation 120 and the substrate 300 but do not extend into the inspection holes 140 or onto the lateral sides 123. This kind of solder joints 310, 310' may for example be formed if only a comparatively small amount of solder material per solder joint 310, 310' is provided or if the contact pads 130 do not extend onto the sidewalls 141 of the inspection holes 140 or onto the lateral sides 123. Still, the solder material may be visible through the inspection holes 140 and proper formation of the inner solder joints 310' may be verified by optical inspection through the inspection holes 140.

In the example shown in FIG. 3B, the solder material at least partially extends into the inspection holes 140. The part of the plating layer of the contact pads 130 which is arranged on the sidewalls 141 of the inspection holes 140 may facilitate this effect. This kind of solder joints 310, 310' may for example be formed in case that a larger amount of solder material per solder joint 310, 310' is used than in the example of FIG. 3A.

In the example shown in FIG. 3C, the inner solder joints 310' extend all the way up the inspection holes 140 and the outer solder joints 310 may possibly extend all the way up the lateral sides 123. The inner solder joints 310' may even protrude from the inspection holes 140 on the second side 122 of the encapsulation 120, forming caps 320. These caps 320 may for example improve the stability of the mechanical bond between the semiconductor package 100 and the substrate 300.

In the case that the inspection holes 140 are filled with solder material, the inspection holes 140 may also fulfill an electrical function apart from their function in optical inspection of the solder joints 310': the inspection holes 140 may be used as vias (vertical interconnect access) which provide an electrical connection between the first and second sides 121, 122 of the encapsulation 120. However, it should be noted that the inspection holes 140 may only be filled with solder material once the semiconductor package 100 is soldered to the substrate 300 and the solder joints 310, 310' are formed. Prior to soldering the semiconductor package 100 to the substrate 300, the inspection holes 140 are essentially empty (except for e.g. the metallization on the sidewalls 141) such that optical inspection of the soldering process is possible as explained further above.

Figure 4A:
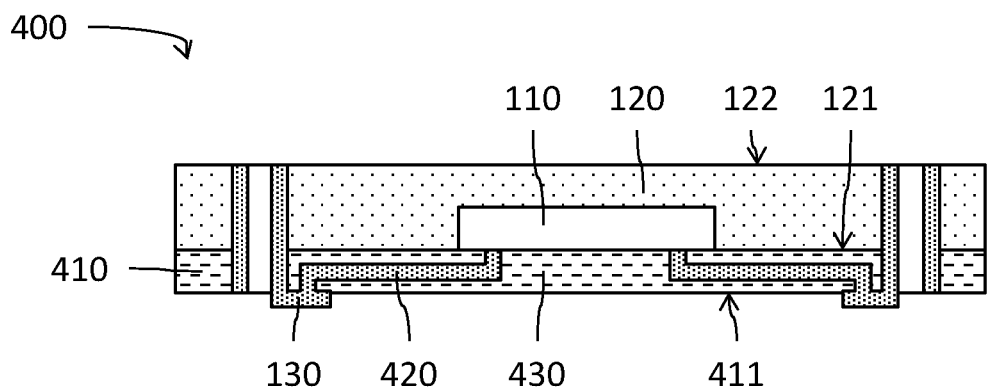
FIGS. 4A and 4B show a sectional view (FIG. 4A) and a top down view (FIG. 4B) of a further semiconductor package comprising inspection holes.
Figure 4B:
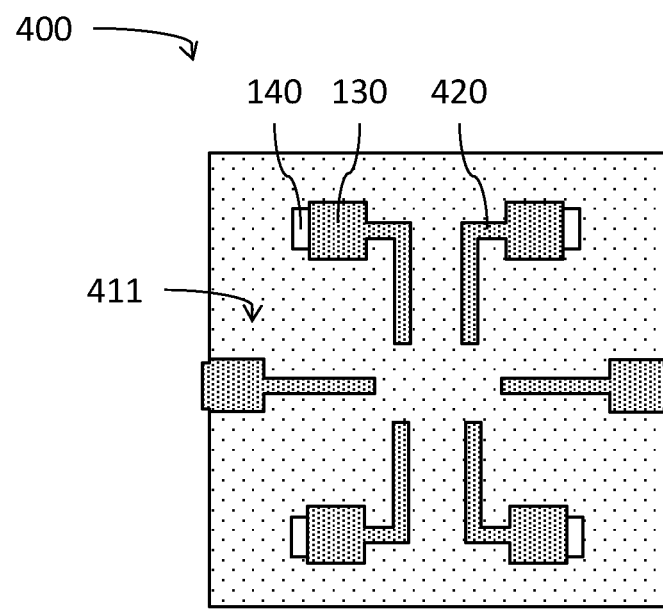

FIGS. 4A and 4B show a semiconductor package 400 which may be similar to or identical with the semiconductor package 100, except that the encapsulation of the semiconductor package 400 further comprises a carrier, wherein the semiconductor die 110 is arranged on the carrier. In the example shown in FIGS. 4A and 4B the carrier comprises a redistribution layer 410. According to another example, the carrier comprises a leadframe, a PCB (printed circuit board), a DCB (direct copper bond), or any other suitable type of substrate.

The redistribution layer 410 may e.g. be arranged on the first side 121 of a molded body of the encapsulation 120. The redistribution layer 410 may comprise conductive tracks 420 coupling the semiconductor die 110 to the contact pads 130. The conductive tracks 420 may be part of the same plating layer as the contact pads 130.

The redistribution layer 410 may further comprise an insulating material 430, wherein the conductive tracks 420 are arranged on the insulating material 430. The contact pads 130 may be arranged on a first side 411 of the redistribution layer 410, wherein the first side 411 faces away from the semiconductor die 110.

According to an example, the insulating material 430 of the redistribution layer 410 is a part of the encapsulation 120. In this case the insulating material 430 may e.g. be a mold compound. According to another example, the insulating material 430 is different from the material of the encapsulation 120. In this case the insulating material 430 may e.g. be a laminate.

As shown in FIG. 4A, the inspection holes 140 fully extend through the encapsulation 120 and also through the redistribution layer 410. In other words, the inspection holes 140 extend from the second side 122 of the encapsulation to the first side 411 of the redistribution layer 410.

FIG. 4B shows a top down view of semiconductor package 400 onto the first side 411 of the redistribution layer 410. In the example shown in FIG. 4B, the inspection holes 140 are arranged along an edge of the respective contact pads 130. However, the inspection holes 140 may also for example also be arranged in the middle of each respective contact pad 130.

FIGS. 5A to 5E show the semiconductor package 100 in various stages of fabrication according to an exemplary method for fabricating semiconductor packages.

Figure 5A:
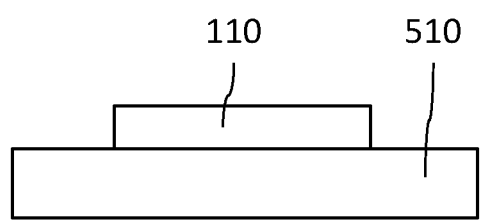
FIGS. 5A to 5E show a semiconductor package in various stages of fabrication according to an exemplary method for fabricating semiconductor packages.

As shown in FIG. 5A, the semiconductor die 110 is provided. Providing the semiconductor die 110 may comprise singulating the semiconductor die 110 from a semiconductor wafer. The semiconductor die 110 may be arranged on a carrier 510, e.g. a temporary carrier like a tape.

Figure 5B:
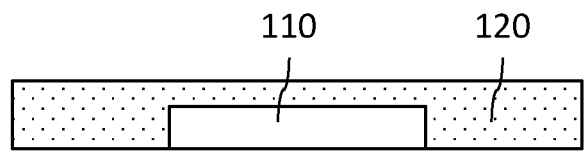

As shown in FIG. 5B, the encapsulation 120 encapsulating the semiconductor die 110 is formed. Forming the encapsulation 120 may e.g. comprise molding over the semiconductor die 110. To this end, the semiconductor die 110 may be placed into a suitable molding tool.

Figure 5C:
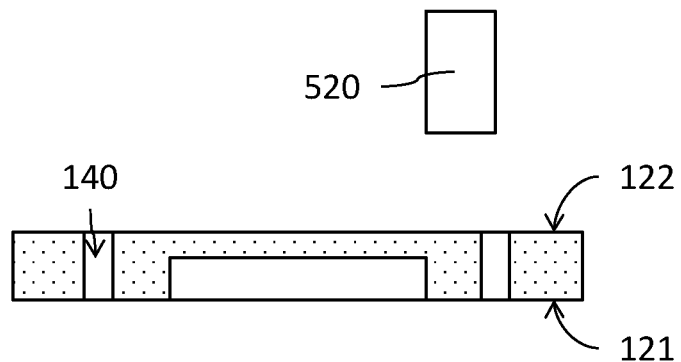

As shown in FIG. 5C, the inspection holes 140 may be formed in the encapsulation 120. Fabricating the inspection holes 140 may e.g. comprise using a laser 520 to laser drill the inspection holes 140. The inspection holes 140 may be drilled from the first side 121 or from the second side 122 of the encapsulation.

The encapsulation 120 may comprise a laser-activatable polymer composition as described further above. The laser 520 may be used to form laser-activated regions on the encapsulation, e.g. at the sidewalls 141 of the inspection holes 140 and possibly also at the regions where the contact pads 130 and the conductive tracks 420 are to be formed.

In the case that the semiconductor package to be fabricated shall also comprises the redistribution layer 410, the redistribution layer 410 may be arranged on the molded body of the encapsulation 120 prior to forming the inspection holes 140. Therefore, the inspection holes 140 may be drilled through the encapsulation 120 and the redistribution layer 140 in a single fabrication act.

Figure 5D:
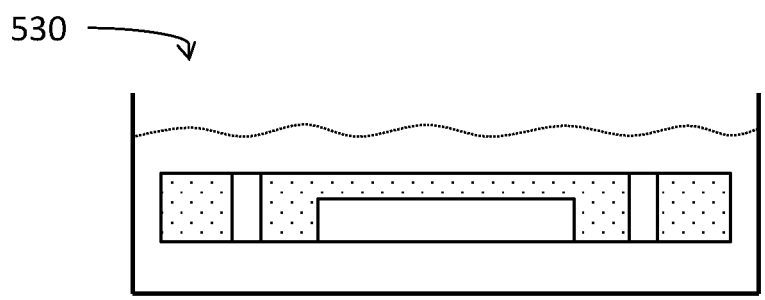

As shown in FIG. 5D, the contact pads 130 and possibly also the conductive tracks 420 and/or the plating layer on the sidewalls 141 of the inspection holes 140 are deposited. This may for example comprise using any suitable metal plating technique. For example, the semiconductor package 100 may be immersed in a chemical bath 530 containing suitable metal ions.

Figure 5E:
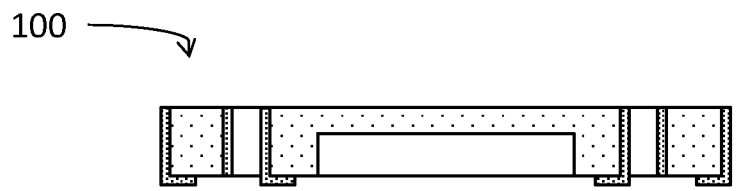

FIG. 5E shows the semiconductor package 100 after the metallization comprising the contact pads 130, the conductive tracks 420 and the plating layer on the sidewalls 141 has been formed. According to an example of the method for fabricating a semiconductor package, solder material is deposited on the contact pads 130 at this point, e.g. in the form of solder balls.

According to the above-described exemplary method for fabricating a semiconductor package, the inspection holes 140 are formed by drilling, e.g. by laser drilling, through the encapsulation 120. According to another example, the inspection holes 140 may be fabricated during the act of molding by using a molding tool which comprises an appropriate structure.

Figure 6:
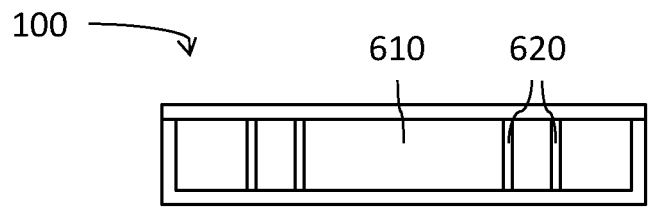
FIG. 6 shows a sectional view of a molding tool which may be used in the fabrication of a semiconductor package comprising inspection holes.

FIG. 6 shows a molding tool 600 comprising a cavity 610 and pins 620 arranged in the cavity 610. The pins 620 are arranged at the position of the inspection holes 140 and the encapsulation 120 may therefore be formed with the inspection holes 140 already in place.

However, in the case that the inspection holes 140 are manufactured by using e.g. the molding tool 600, it may still be necessary to use the laser 520 for forming the laser-activated regions on the encapsulation 120.

Figure 7:
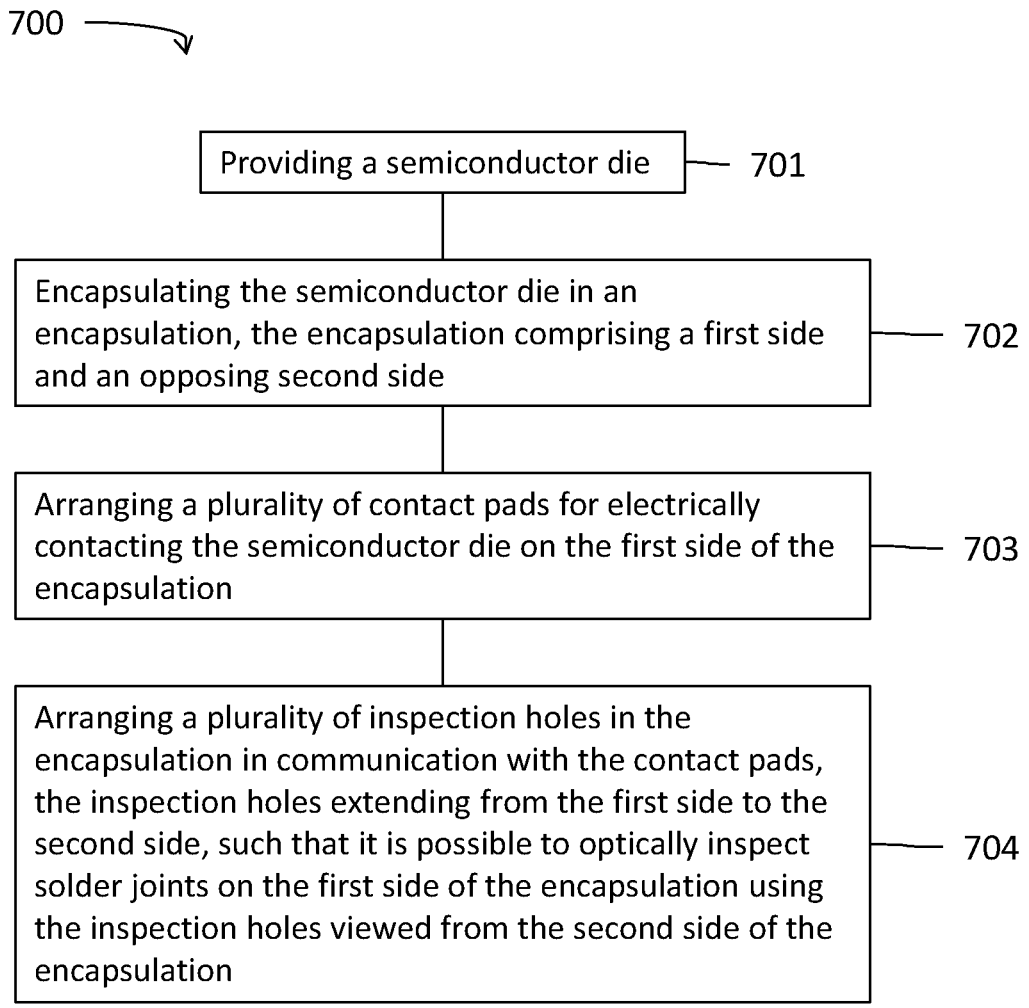
FIG. 7 is a flow chart of an exemplary method for fabricating a semiconductor package.

FIG. 7 is a flow chart of a method 700 for fabricating semiconductor packages. The method 700 may e.g. be used for fabricating the semiconductor packages 100 and 400.

The method 700 comprises at 701 an act of providing a semiconductor die, at 702 an act of encapsulating the semiconductor die in an encapsulation, the encapsulation comprising a first side and an opposing second side, at 703 an act of arranging a plurality of contact pads for electrically contacting the semiconductor die on the first side of the encapsulation, and at 704 an act of arranging a plurality of inspection holes in the encapsulation in communication with the contact pads, the inspection holes extending from the first side to the second side, such that solder joints on the first side of the encapsulation are optically inspectable using the inspection holes viewed from the second side of the encapsulation.

In the following, the semiconductor package and the method for fabricating a semiconductor package are further explained using specific examples.

Example 1 is a semiconductor package, comprising: a semiconductor die, an encapsulation encapsulating the semiconductor die, the encapsulation comprising a first side and an opposing second side, a plurality of contact pads for electrically contacting the semiconductor die, the contact pads being arranged on the first side of the encapsulation, and a plurality of inspection holes arranged in communication with the contact pads and extending from the first side to the second side, such that solder joints on the first side of the encapsulation are optically inspectable using the inspection holes viewed from the second side of the encapsulation.

Example 2 is the semiconductor package of example 1, further comprising: a plating layer arranged in the inspection holes.

Example 3 is the semiconductor package of example 2, wherein the plating layer in each inspection hole is contiguous with the respective contact pad.

Example 4 is the semiconductor package of example 2 or 3, wherein the encapsulation comprises a molded body.

Example 5 is the semiconductor package of example 4, wherein the molded body comprises a laser-activatable polymer composition and wherein the plating layer is arranged on laser-activated regions on the molded body.

Example 6 is the semiconductor package of example 4 or 5, wherein the encapsulation further comprises a laminate, wherein the contact pads are arranged on the laminate, and wherein the inspection holes extend through the molded body and through the laminate.

Example 7 is the semiconductor package of one of the preceding examples, further comprising: a redistribution layer electrically connecting the semiconductor die to the contact pads, wherein the inspection holes are not part of the redistribution layer.

Example 8 is the semiconductor package of one of the preceding examples, wherein the encapsulation comprises lateral sides connecting the first and second sides, wherein first ones of the contact pads are arranged along the lateral sides, wherein second ones of the contact pads are arranged spaced away from the lateral sides, and wherein the inspection holes are arranged solely above the second ones of the contact pads.

Example 9 is the semiconductor package of one of the preceding examples, wherein each inspection hole is arranged along an edge of the respective contact pad.

Example 10 is the semiconductor package of one of the preceding examples, wherein the inspection holes have a diameter of at least 100 µm, measured in a plane that comprises the first or second side of the encapsulation.

Example 11 is a method for fabricating a semiconductor package, the method comprising: providing a semiconductor die, encapsulating the semiconductor die in an encapsulation, the encapsulation comprising a first side and an opposing second side, arranging a plurality of contact pads for electrically contacting the semiconductor die on the first side of the encapsulation, and arranging a plurality of inspection holes in the encapsulation in communication with the contact pads, the inspection holes extending from the first side to the second side, such that solder joints on the first side of the encapsulation are optically inspectable using the inspection holes viewed from the second side of the encapsulation.

Example 12 is the method of example 11, wherein the encapsulation comprises a laser-activatable polymer composition and wherein the method further comprises: irradiating the encapsulation inside the inspection holes with a laser to fabricate laser-activated regions, and plating over the laser-activated regions to fabricate a plating layer in the inspection holes.

Example 13 is the method of example 12, wherein the contact pads and the plating layer are fabricated in the same plating process.

Example 14 is the method of one of examples 11 to 13, wherein the inspection holes are fabricated by laser drilling through the encapsulation.

Example 15 is the method of one of examples 11 to 13, wherein encapsulating the semiconductor die comprises molding and wherein the inspection holes are fabricated by molding with a structured molding tool.

Example 16 is the method of one of examples 11 to 15, wherein each inspection hole is arranged along an edge of the respective contact pad.

Example 17 is the semiconductor package of one of examples 1 to 10, wherein each inspection hole or at least a core of each inspection hole is free of any material, in particular free of solder material.

Example 18 is the method of one of examples 11 to 16, further comprising: coupling the semiconductor package to a substrate using solder joints.

Example 19 is the method of example 18, further comprising: optically inspecting the solder joints through the inspection holes.

Example 20 is an apparatus comprising means for performing the method according to anyone of examples 11 to 16, 18 and 19.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor package, comprising:
    a semiconductor die;
    an encapsulation encapsulating the semiconductor die, the encapsulation comprising a first side and an opposing second side;
    a plurality of contact pads for electrically contacting the semiconductor die, the contact pads being arranged on the first side of the encapsulation; and
    a plurality of inspection holes arranged in communication with the contact pads and extending from the first side to the second side, such that solder joints and outer edge sides of the contact pads on the first side of the encapsulation are optically inspectable using the inspection holes viewed from the second side of the encapsulation wherein the outer edge sides of the contact pads only cover a portion of each of the plurality of inspection holes.

2. The semiconductor package of claim 1, further comprising:
    a plating layer arranged in the inspection holes.

3. The semiconductor package of claim 2, wherein the plating layer in each inspection hole is contiguous with the respective contact pad.

4. The semiconductor package of claim 2, wherein the encapsulation comprises a molded body.

5. The semiconductor package of claim 4, wherein the molded body comprises a laser-activatable polymer composition, and wherein the plating layer is arranged on laser-activated regions on the molded body.

6. The semiconductor package of claim 4, wherein the encapsulation further comprises a laminate, wherein the contact pads are arranged on the laminate, and wherein the inspection holes extend through the molded body and through the laminate.

7. The semiconductor package of claim 1, further comprising:
    a redistribution layer electrically connecting the semiconductor die to the contact pads, wherein the inspection holes are not part of the redistribution layer.

8. The semiconductor package of claim 1, wherein the encapsulation comprises lateral sides connecting the first and second sides, wherein first ones of the contact pads are arranged along the lateral sides, wherein second ones of the contact pads are arranged spaced away from the lateral sides, and wherein the inspection holes are arranged solely above the second ones of the contact pads.

9. The semiconductor package of claim 1, wherein each inspection hole is arranged along an edge of the respective contact pad.

10. The semiconductor package of claim 1, wherein the inspection holes have a diameter of at least 100 µm, measured in a plane that comprises the first or second side of the encapsulation.

* * * * *